(12) United States Patent
Yang et al.

(10) Patent No.: US 9,640,409 B1
(45) Date of Patent: May 2, 2017

(54) SELF-LIMITED PLANARIZATION OF HARDMASK

(71) Applicant: Lam Research Corporation, Fremont, CA (US)

(72) Inventors: Dengliang Yang, Union City, CA (US); Joon Hong Park, Dublin, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/013,400

(22) Filed: Feb. 2, 2016

(51) Int. Cl.
*H01L 21/311* (2006.01)
*H01L 21/308* (2006.01)
*H01L 21/3065* (2006.01)

(52) U.S. Cl.
CPC ...... *H01L 21/3088* (2013.01); *H01L 21/3065* (2013.01); *H01L 21/3081* (2013.01); *H01L 21/3085* (2013.01); *H01L 21/3086* (2013.01)

(58) Field of Classification Search
CPC .................................................. H01L 21/3088
USPC ............................................ 216/46; 438/696
See application file for complete search history.

(56) References Cited

U.S. PATENT DOCUMENTS

| 8,592,328 B2 | 11/2013 | Hausmann et al. |
| 9,059,678 B2 | 6/2015 | Long et al. |
| 2007/0026684 A1* | 2/2007 | Parascandola ...... H01L 21/0337 438/733 |
| 2014/0120737 A1 | 5/2014 | Swaminathan et al. |

OTHER PUBLICATIONS

Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Appl. No. 14/945,680, Drewery et al.
U.S. Appl. No. 62/275,837, Treadwell et al.

* cited by examiner

*Primary Examiner* — Roberts Culbert (57) ABSTRACT

A method for processing a semiconductor substrate includes a) providing a substrate stack including a first layer, a plurality of cores arranged in a spaced relationship on the first layer and one or more underlying layers arranged below the first layer; b) depositing a conformal layer on the first layer and the plurality of cores; c) partially etching the conformal layer to create spacers arranged adjacent to sidewalls of the plurality of cores, wherein the partial etching of the conformal layer causes upper portions of the spacers to have an asymmetric profile; d) selectively etching the plurality of cores relative to the spacers and the first layer; e) depositing polymer film on sidewalls of the spacers; and f) etching the upper portions of the spacers to remove the asymmetric profile and to planarize the upper portions of the spacers.

32 Claims, 7 Drawing Sheets

SELF-LIMITED PLANARIZATION OF HARDMASK

FIELD

The present disclosure relates to substrate processing systems and methods, and more particularly substrate processing systems and methods for performing planarization of hardmasks.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to deposit and etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Double patterning approaches may be used for pitch splitting. A core layer is deposited and patterned to define a plurality of spaced cores. A conformal layer is deposited on the cores. Then, the conformal layer is etched using an anisotropic etch process to etch most of the conformal layer while leaving behind spacers on sidewalls of the cores. The cores are selectively etched. Then, a critical dimension (CD) of the spacers is transferred to a lower layer.

After etching, the shape of upper portions of the spacers is asymmetric primarily due to ion sputtering during the anisotropic etching. As a result of the asymmetric shape, there is increased variability in the critical dimension (CD) when transferring to the lower layer. If additional pitch splitting is performed, the mask is usually transferred to the lower layer to create a squared shape.

SUMMARY

A method for processing a semiconductor substrate includes a) providing a substrate stack including a first layer, a plurality of cores arranged in a spaced relationship on the first layer and one or more underlying layers arranged below the first layer; b) depositing a conformal layer on the first layer and the plurality of cores; c) partially etching the conformal layer to create spacers arranged adjacent to sidewalls of the plurality of cores, wherein the partial etching of the conformal layer causes upper portions of the spacers to have an asymmetric profile; d) selectively etching the plurality of cores relative to the spacers and the first layer; e) depositing polymer film on sidewalls of the spacers; and f) etching the upper portions of the spacers to remove the asymmetric profile and to planarize the upper portions of the spacers.

In other features, the method further includes g) etching the polymer film. The method includes repeating b) to g) one or more times.

In other features, f) is performed in a substrate processing chamber including a substrate support, an upper chamber region, an inductive coil arranged outside of the upper chamber region, a lower chamber region including the substrate support and a gas dispersion device arranged between the upper chamber region and the lower chamber region. The gas dispersion device includes a plurality of holes in fluid communication with the upper chamber region and the lower chamber region.

In other features, the method includes controlling pressure in the substrate processing chamber during f) in a range from 0.4 Torr to 10 Torr; and supplying an etch gas mixture including fluorine-based gas to the upper chamber region.

In other features, the method includes supplying power to the inductive coil in a range from 200 W to 3 kW during f). The method includes supplying RF bias power to the substrate support in a range from 50 W to 1000 W during f).

In other features, the etch gas mixture includes a gas selected form a group consisting of sulfur hexafluoride ($SF_6$), nitrogen trifluoride ($NF_3$), carbon tetrafluoride (CEO, difluoromethane ($CH_2F_2$), fluoromethane ($CH_3F$), hexafluoro-2-butyne ($C_4F_6$), and octafluorocyclobutane ($C_4F_8$). The etch gas mixture further includes one or more gases selected from a group consisting of argon (Ar) and helium (He). The depositing the conformal layer in b) includes atomic layer deposition. The partial etching in c) is performed in an inductively coupled plasma (ICP) chamber.

In other features, the plurality of cores includes amorphous silicon film. The conformal layer includes a material selected form a group consisting of silicon nitride, silicon and silicon dioxide.

A method for processing a semiconductor substrate includes a) providing a substrate stack including a first layer, a plurality of cores arranged in a spaced relationship on the first layer and one or more underlying layers arranged below the first layer; b) depositing a conformal layer on the first layer and the plurality of cores; c) partially etching the conformal layer to create spacers arranged adjacent to sidewalls of the plurality of cores, wherein the partial etching of the conformal layer causes upper portions of the spacers to have an asymmetric profile, and wherein a polymer film remains on sidewalls of the spacers after c); and d) etching the upper portions of the spacers to remove the asymmetric profile and to planarize the upper portions of the spacers.

In other features, the method includes e) etching the polymer film and the plurality of cores. The method includes repeating b) to e) one or more times.

In other features, d) is performed in a substrate processing chamber including a substrate support, an upper chamber region, an inductive coil arranged outside of the upper chamber region, a lower chamber region including the substrate support and a gas dispersion device arranged between the upper chamber region and the lower chamber region. The gas dispersion device includes a plurality of holes in fluid communication with the upper chamber region and the lower chamber region.

In other features, the method includes controlling pressure in the substrate processing chamber during d) in a range from 0.4 Torr to 10 Torr; and supplying an etch gas mixture including fluorine-based gas to the upper chamber region. The method includes supplying power to the inductive coil in a range from 200 W to 3 kW during d).

The method includes supplying RF bias power to the substrate support in a range from 50 W to 1000 W during d). The etch gas mixture a gas selected form a group consisting of sulfur hexafluoride ($SF_6$), nitrogen trifluoride ($NF_3$), carbon tetrafluoride ($CF_4$), difluoromethane ($CH_2F_2$), fluoromethane ($CH_3F$), hexafluoro-2-butyne ($C_4F_6$), and octafluorocyclobutane ($C_4F_8$). The etch gas mixture further includes one or more gases selected from a group consisting of argon (Ar) and helium (He). The depositing the conformal layer in b) includes atomic layer deposition. The partial etching in c) is performed in an inductively coupled plasma (ICP) chamber. The plurality of cores includes amorphous silicon film. The conformal layer includes a material selected form a group consisting of silicon nitride, silicon and silicon dioxide.

A self-limiting etching method for planarizing asymmetric surfaces of a substrate includes arranging a substrate on a substrate support of a substrate processing chamber. The substrate includes a feature including an upper portion with an asymmetric profile. The substrate processing chamber includes an upper chamber region, an inductive coil arranged outside of the upper chamber region, a lower chamber region including the substrate support and a gas dispersion device arranged between the upper chamber region and the lower chamber region. The method includes controlling pressure in the substrate processing chamber in a range from 0.4 Torr to 10 Torr; supplying an etch gas mixture including fluorine-based gas to the upper chamber region; and etching the upper portion of the feature to remove the asymmetric profile and to planarize the upper portion of the feature.

In other features, the method includes supplying power to the inductive coil in a range from 200 W to 3 kW during the etching. The method includes supplying RF bias power to the substrate support in a range from 50 W to 1000 W during the etching. The etch gas mixture a gas selected form a group consisting of sulfur hexafluoride ($SF_6$), nitrogen trifluoride ($NF_3$), carbon tetrafluoride ($CF_4$), difluoromethane ($CH_2F_2$), fluoromethane ($CH_3F$), hexafluoro-2-butyne ($C_4F_6$), and octafluorocyclobutane ($C_4F_8$).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for modifying an asymmetric shape of a hard mask using a self-limited planarization method. In some examples, rounded or asymmetric mask profiles of an upper portion of the spacers are modified to a planar profile. The etching process that is performed is self-limited. In other words, the etching stops when the asymmetric surface being etched becomes planar.

The planarizing method according to the present disclosure may be used during multiple patterning schemes to reduce critical dimension (CD) transfer variability by creating a symmetric, square-shaped mask. The same mask can be used directly for a subsequent round of pitch splitting without requiring transfer to another layer. In some examples, the method may be used to modify mask films including silicon nitride (SiN), silicon (Si) and silicon dioxide ($SiO_2$). While the foregoing description relates to planarization of spacers in a double patterning context, the self-limiting nature of the etching process described herein can be used to planarize other asymmetric structures.

In some examples, the planarizing etch is performed in a dual chamber processing system described below in FIG. 17 using ion-assisted radical etch in a high pressure environment (e.g. between 0.4 Torr and 10 Torr).

Figures 1, 2:
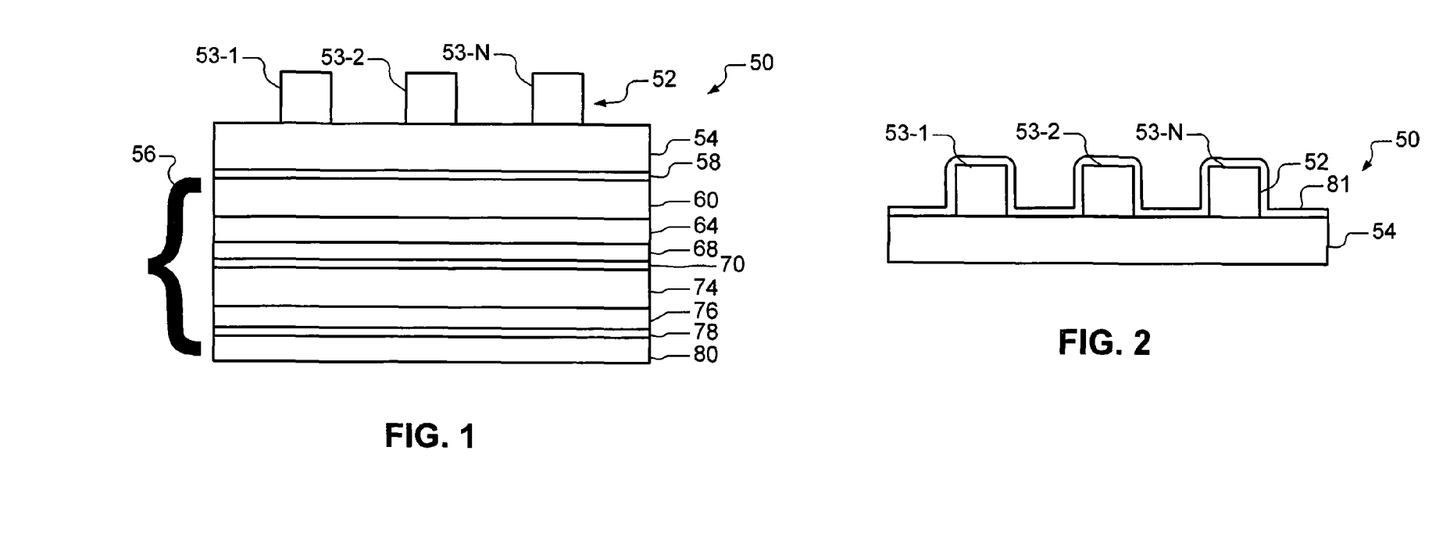
FIG. 1 is a side cross-sectional view of an example of a stack including cores according to the present disclosure.
FIG. 2 is a side cross-sectional view of an example of a conformal layer deposited on the stack and cores of FIG. 1 according to the present disclosure.

Referring now to FIG. 1, a stack 50 includes a core layer 52 that is deposited and patterned to define one or more cores 53-1, 53-2, . . . and 53-N (collectively cores 53) that are spaced apart, where N is an integer greater than one. The core layer 52 is arranged on a layer 54, which is arranged on one or more underlying layers 56. For example only, the core layer 52 may be made of amorphous silicon (a-Si). The layer 54 may be made of an oxide film. In some examples, the underlying layers 56 may include layers 58, 60, 64, 68, 70, 74, 76, 78 and 80. As can be appreciated, examples of the underlying layers 56 will vary for different applications. In other words, the number of layers and types of film materials that are used in the underlying layers 56 may be varied. In FIGS. 2-16 described below, the underlying layers 56 are omitted.

In some examples, the layer 58 includes a core hard mask film such as silicon oxycarbide (SiOC), the layer 60 includes a core layer such as amorphous carbon (a-C), the layer 64 includes a core layer such as amorphous silicon (a-Si), the layer 68 includes an etch stop layer (ESL) such as silicon nitride (SiN), the layer 70 includes a clear hard mask (HM) such as a-Si, layer 74 includes a fin hardmask such as silicon dioxide ($SiO_2$), the layer 76 includes a pad layer such as SiN, the layer 78 includes a pad layer such as $SiO_2$ and the layer 80 includes a silicon (Si) substrate. However, other combination of layers and film materials may be used.

Referring now to FIG. 2, a conformal layer 81 is deposited on the core layer 52 of the stack 50. In some examples, the conformal layer 81 is deposited using atomic layer deposition (ALD) and plasma-enhanced ALD (PEALD). In some examples, the conformal layer 81 includes silicon nitride (SiN), silicon (Si) or silicon dioxide ($SiO_2$). For example, conformal deposition of SiN is disclosed in commonly-assigned U.S. Pat. No. 8,592,328, issued on Nov. 26, 2013, which is hereby incorporated by reference in its entirety.

Figure 3:
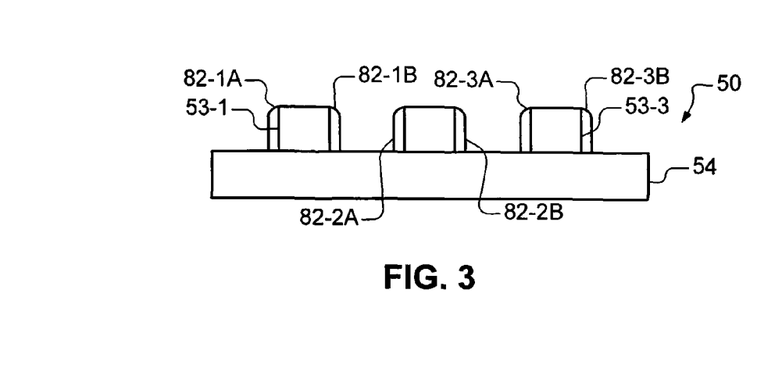
FIG. 3 is a side cross-sectional view of an example of the stack, cores and spacers after etching of the conformal layer according to the present disclosure.

Referring now to FIG. 3, etching of the stack 50 is performed. In some examples, the etching is anisotropic, is selective to the film used for the under layer 54, and is performed in a plasma etch chamber such as a transformer coupled plasma (TCP) chamber. As used herein, the term selective etching refers to etching one film material more than other exposed film materials. In some examples, the selective etching ratio is greater than 10:1, 100:1, 1000:1, etc. An example of a TCP chamber is shown and described in U.S. Pat. No. 9,059,678 that issued on Jun. 15, 2016 and is entitled "TCCT MATCH CIRCUIT FOR PLASMA ETCH CHAMBERS", which is hereby incorporated by reference in its entirety.

In some examples, the etch chemistry includes a gas mixture including fluoromethane ($CH_3F$) and carbon dioxide ($CO_2$), although other etch chemistry may be used. In other examples, the etch chemistry includes a gas mixture including difluoromethane ($CH_2F_2$), molecular oxygen ($O_2$) and argon (Ar), or fluoromethane ($CH_3F$), $O_2$ and Ar, although other etch chemistry may be used or sequential use of two or more chemistries may be used. In some examples, the coil power is in a range from 200 W to 800 W and a substrate bias is in a range from 100V to 500 V. In some examples, the chamber pressure is in a range from 5 mTorr to 100 mTorr. The bias to the substrate support can be a continuous wave, pulsed or sequential use of continuous wave and pulsed waves may be used.

In FIG. 3, the stack 50 is shown after etching is performed. The conformal layer 80 is removed in most locations other than adjacent to the sidewalls of the cores 53-1, 53-2, 53-3, ... , and 53-N. Spacers 82-1A, 82-1B, 82-2A, 82-2B, 82-3A, 82-3B, ... 82-NA, and 82-NB (collectively spacers 82) are defined and are located adjacent to the sidewalls of the cores 53 after etching. In some examples, the spacers are rounded and include convex arcuate portions that extend slightly upwardly from outer sides of the spacers to inner sides of the spacers. Some polymer film (not shown) may remain on sidewalls of the spacers 82 after the anisotropic etch. The polymer film is removed during subsequent etching of the core described below.

Figure 4:
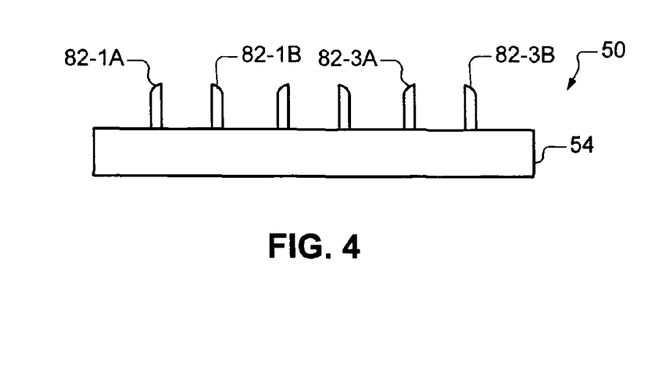
FIG. 4 is a side cross-sectional view of an example of the stack after the cores are etched according to the present disclosure.
Figure 5:
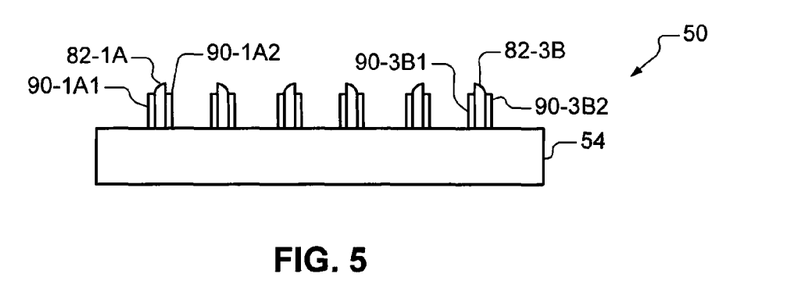
FIG. 5 is a side cross-sectional view of an example of a polymer film deposited on sidewalls of the spacers of FIG. 4 according to the present disclosure.

Referring now to FIGS. 4-5, further processing of the stack 50 is shown. In FIG. 4, selective etching of the stack 50 is performed to remove the cores 53 and leave the spacers 82. In some examples, the etch chemistry includes a gas mixture of nitrogen trifluoride ($NF_3$) and hydrogen bromide (HBr), although other chemistry can be used. In some examples, the coil power is in a range from 200 W to 2000 W and a substrate bias is in a range from 0V to 500 V. In some examples, the chamber pressure is in a range from 5 mTorr to 100 mTorr. The bias to the substrate support can be a continuous wave, pulsed or sequential use of continuous wave and pulsed waves may be used.

In FIG. 5, polymer film is deposited on opposite sidewalls of the spacers 82 as can be seen at 90-1A1, 90-1A2, ... , 90-3B1 and 90-3B2 (collectively polymer film 90). In some examples, the polymer film 90 is deposited in the TCP chamber using gas chemistry including methane ($CH_4$) and argon (Ar) or methane, argon and helium (He), RF power between 50 and 3000 W and RF bias power between 0 and 1000 W.

Figure 6:
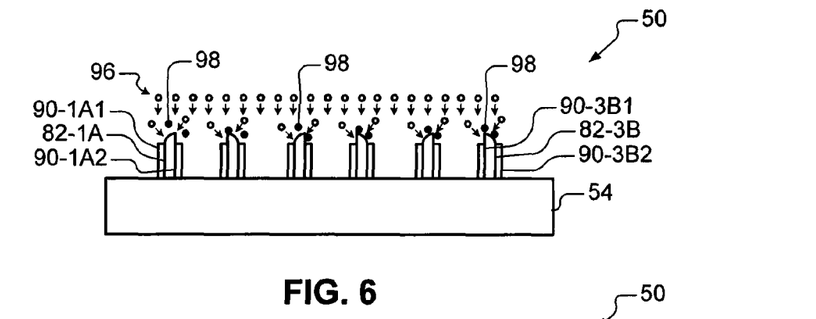
FIG. 6 is a side cross-sectional view illustrating an example of etching of asymmetric upper portions of the spacers of FIG. 5 according to the present disclosure.
Figure 7:
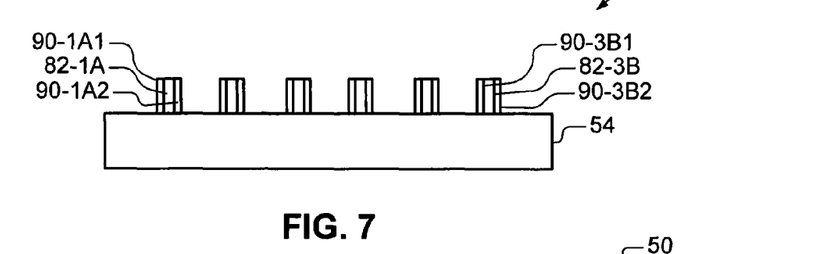
FIG. 7 is a side cross-sectional view illustrating an example of the stack after flattening of the upper portions of the spacers according to the present disclosure.

Referring now to FIGS. 6-7, further processing of the stack 50 is shown. In FIG. 6, a planarizing etch is performed to flatten the round, curved or asymmetric upper profile of the spacers 82. In some examples, the process chamber described below in conjunction with FIG. 17 is used as will be described further below. As can be seen in FIG. 6, ions 96 bombard the round, curved or asymmetric profile of the spacers 82 during etching and radicals 98 are created. The ions 96 have relatively low ion energy and a high sputtering yield. The sidewalls of the spacers 82 are passivated with the polymer film 90. The ions 96 have a large distribution angle with low ion energy. The exposed area has a high coverage of radicals 98 and is etched until it is a relatively planar profile, which can be seen in FIG. 7.

Figure 8:
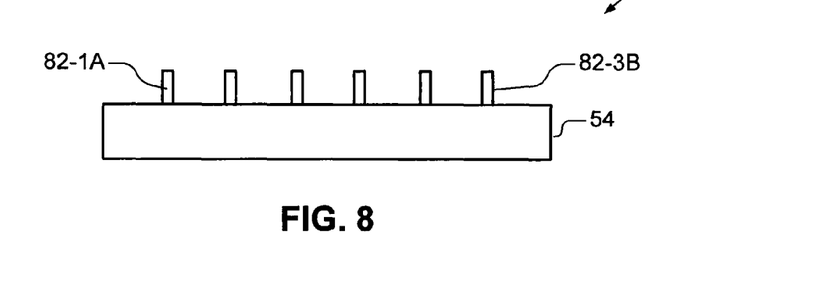
FIG. 8 is a side cross-sectional view illustrating an example of the stack after removal of the polymer film according to the present disclosure.
Figure 9:
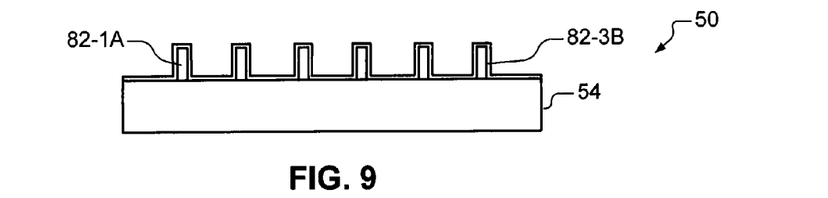
FIG. 9 is a side cross-sectional view of an example of another conformal layer deposited on the stack of FIG. 8 to perform additional pitch splitting according to the present disclosure.

Referring now to FIGS. 8-9, further processing of the stack 50 is shown. In FIG. 8, the polymer film 90 is selectively etched relative to the spacers 82. In some examples, the etching process is performed in an ICP chamber. In some examples, a dry clean step is used to remove the polymer film from sidewalls of the spacers using a gas selected from a group consisting of molecular oxygen ($O_2$), molecular nitrogen ($N_2$) or molecular hydrogen ($H_2$), RF power between 300 W and 3000 W.

If the pitch of the spacers 82 is to be doubled again, another conformal layer 100 is deposited in FIG. 9 (in a manner similar to FIG. 2) and the process shown in FIGS. 3-7 is repeated one or more times.

Figure 10:
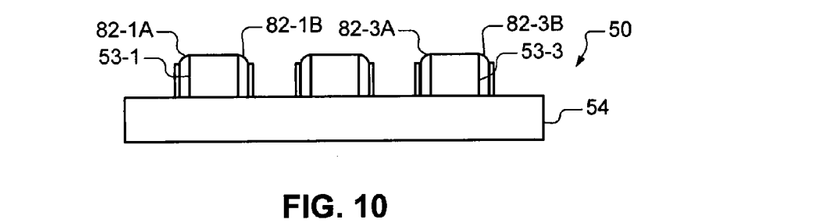
FIG. 10 is a side cross-sectional view of another example of a core layer, spacers and polymer film according to the present disclosure.
Figure 11:
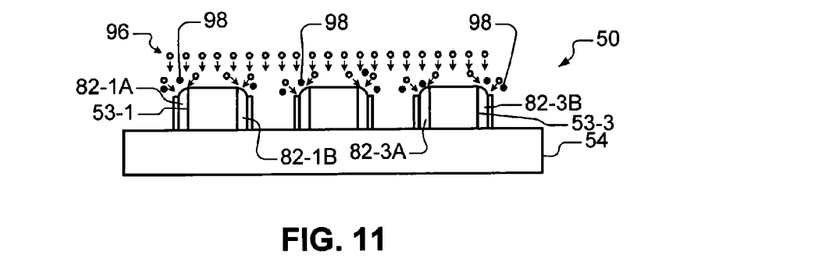
FIG. 11 is a side cross-sectional view illustrating etching of the stack of FIG. 10 according to the present disclosure.
Figure 12:
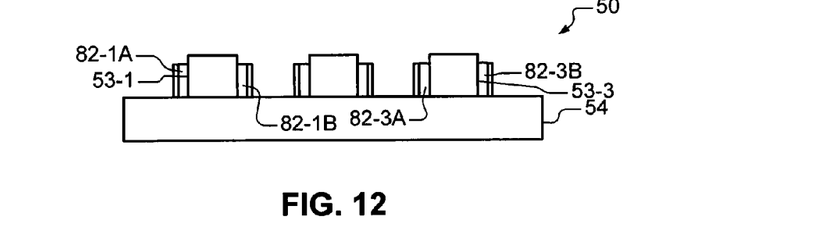
FIG. 12 is a side cross-sectional view illustrating the stack of FIG. 11 after etching according to the present disclosure.

Referring now to FIGS. 10-12, planarizing of an upper surface of the spacers 82 can be performed before etching of the cores 53. In FIG. 10, after depositing the conformal layer in FIG. 2, the etching process is performed to remove the conformal layer 81 and leave the spacers adjacent to the sidewalls of the cores. After etching, polymer film 90 still remains on sidewalls of the spacers 82 as can be seen in FIG. 10. In some examples, the etch process of FIG. 3 is used.

In FIG. 11, a planarizing etch is performed to flatten the round, curved or asymmetric profile of the spacers 82 in a manner similar to that described above in FIG. 6. As can be seen in FIG. 11, ions 96 bombard the round, curved or asymmetric profile of the spacers 82 and radicals 98 are created. The ions 96 have relatively low ion energy and a high sputtering yield. The exposed area of the spacers 82 is etched to planarize the surface as can be seen in FIG. 12. In other cases, the core materials 53-1, 53-2 and 53-N may be recessed to the same height as 82-1A, 82-1B, 82-3A and 82-3B.

Figure 13:
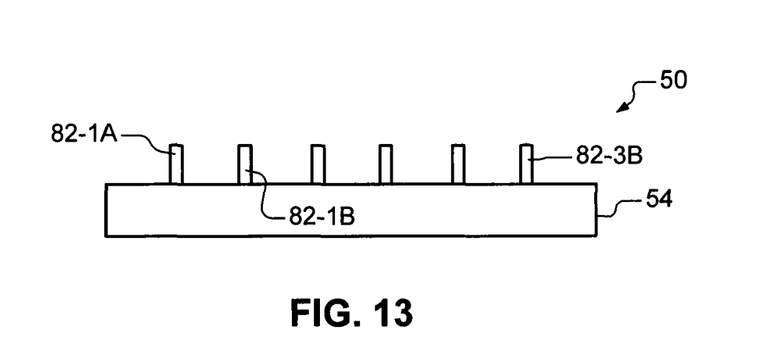
FIG. 13 is a side cross-sectional view illustrating removal of the core layer and polymer film according to the present disclosure.
Figure 14:
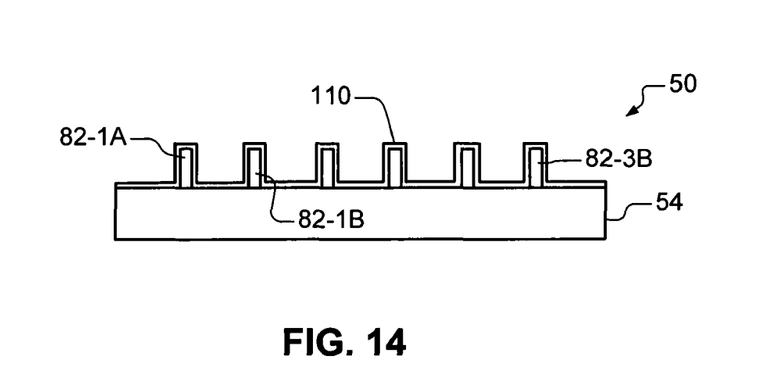
FIG. 14 is a side cross-sectional view of an example of another conformal layer deposited on the stack of FIG. 13 to perform additional pitch splitting according to the present disclosure.

Referring now to FIGS. 13-14, further processing of the stack is shown. In FIG. 13, the polymer film 90 and the cores 53 are selectively etched relative to the spacers 82. If the spacers 82 are to be doubled again, another conformal layer 110 is deposited and the process shown in FIGS. 2 and 10-13 is repeated one or more times.

Figure 15:
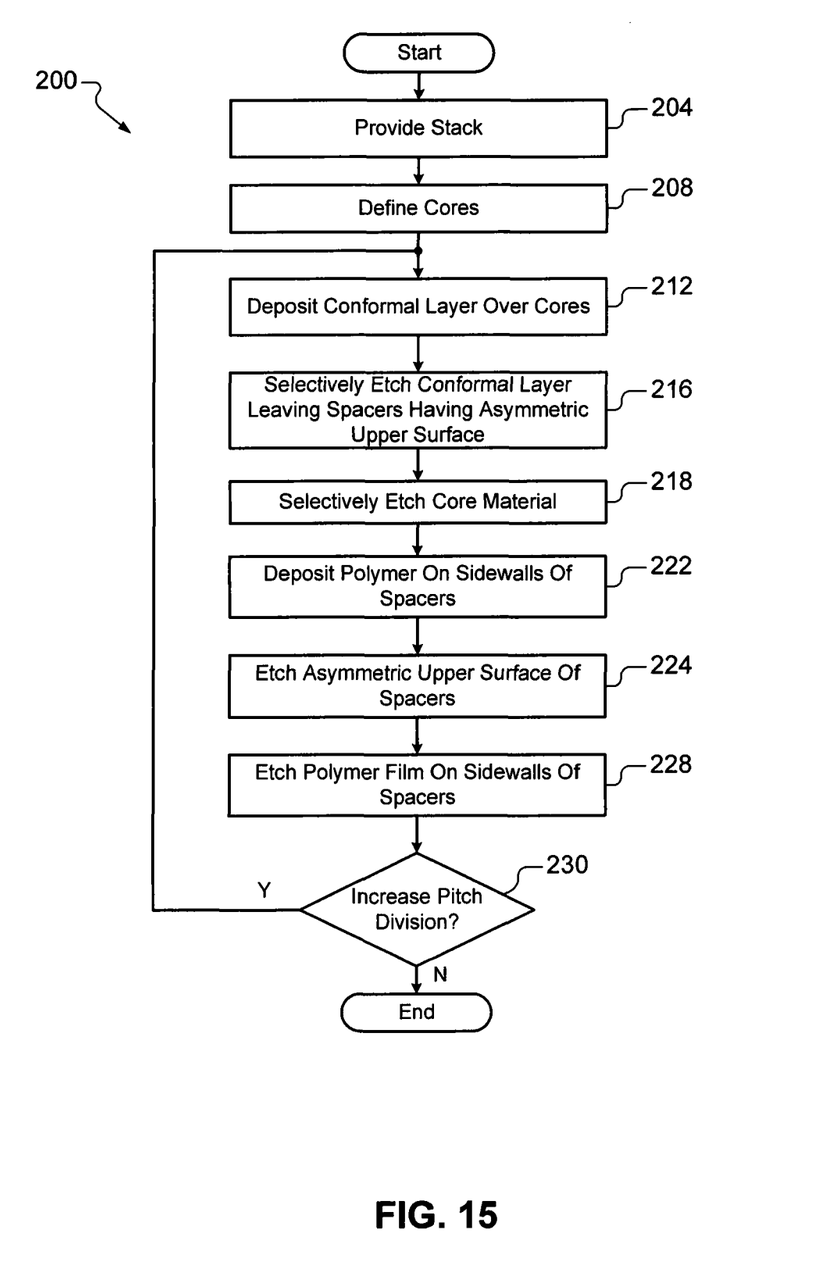
FIG. 15 is a flowchart illustrating an example of a method for planarizing upper portions of the spacers according to the present disclosure.

Referring to FIG. 15, a method 200 for planarizing asymmetric spacers is shown. At 204, the stack is provided. At 208, cores are defined in an upper layer of the stack. Alternatively, the stack can be provided with the cores already defined. At 212, a conformal layer is deposited on the stack over the cores. The conformal layer thickness may be varied to define critical dimensions of final transfer layer lines.

At 216, the conformal layer is selectively etched. Spacers having an asymmetric upper surface remain after etching (for example, see FIG. 3). At 218, the core material is selectively etched relative to the spacers. At 222, polymer film is deposited on sidewalls of the spacers. At 224, the asymmetric upper surfaces of the spacers are etched to create relatively planar surfaces. At 228, the polymer film on the sidewalls of the spacers is selectively etched. If additional pitch division is desired, the method 200 returns to 212. Otherwise, the method 200 ends.

Figure 16:
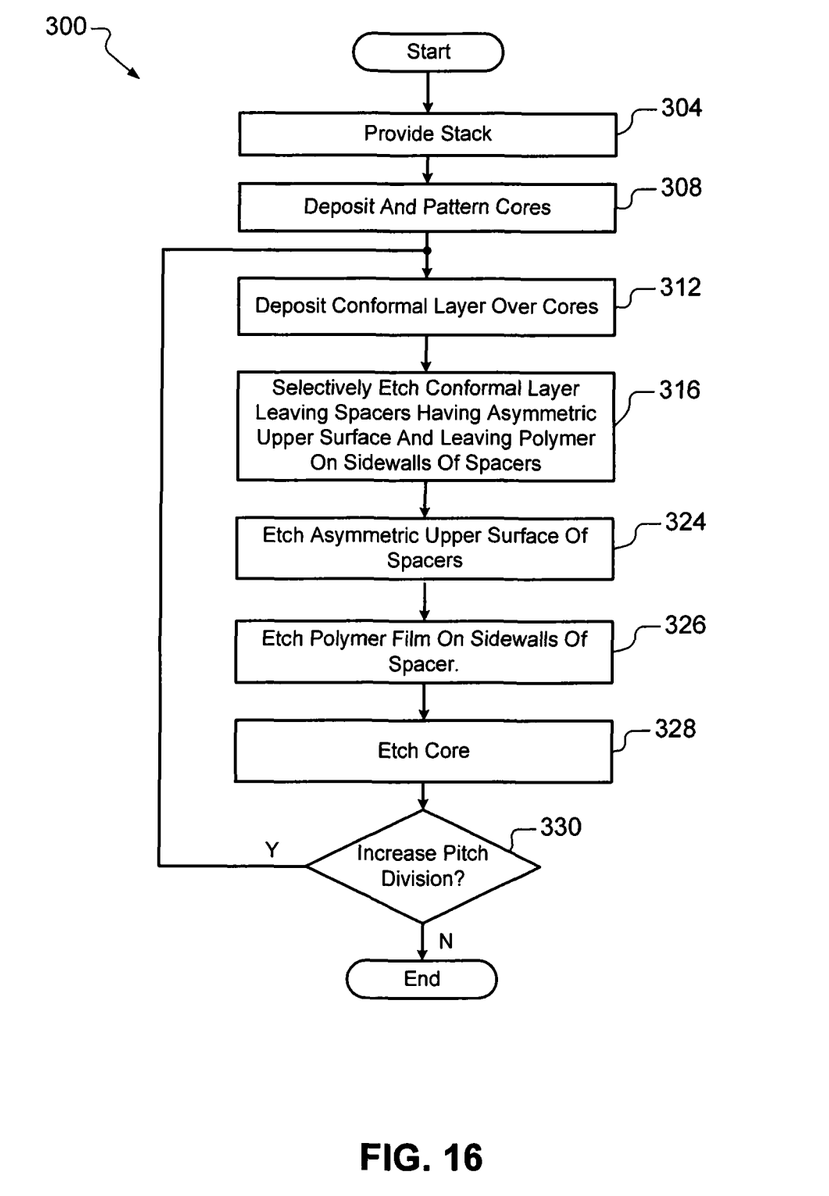
FIG. 16 is a flowchart illustrating another example of a method for planarizing upper portions of the spacers according to the present disclosure.

Referring to FIG. 16, a method 300 for planarizing asymmetric spacers is shown. At 304, the stack is provided. At 308, cores are defined in an upper layer of the stack. Alternatively, at 312, a conformal layer is deposited on the stack over the cores. At 316, the conformal layer is selectively etched. Spacers having an asymmetric upper surface remain after etching. Polymer film is deposited on sidewalls thereof during etching as can be seen in FIG. 10.

At 324, the asymmetric upper surface of the spacers is etched. At 326, the polymer on the sidewalls of the spacers is etched. At 328, the core is etched. In some examples, 326 and 328 may be a single etch step. If additional pitch division is desired, the method 300 returns to 312. Otherwise, the method 300 ends.

Figure 17:
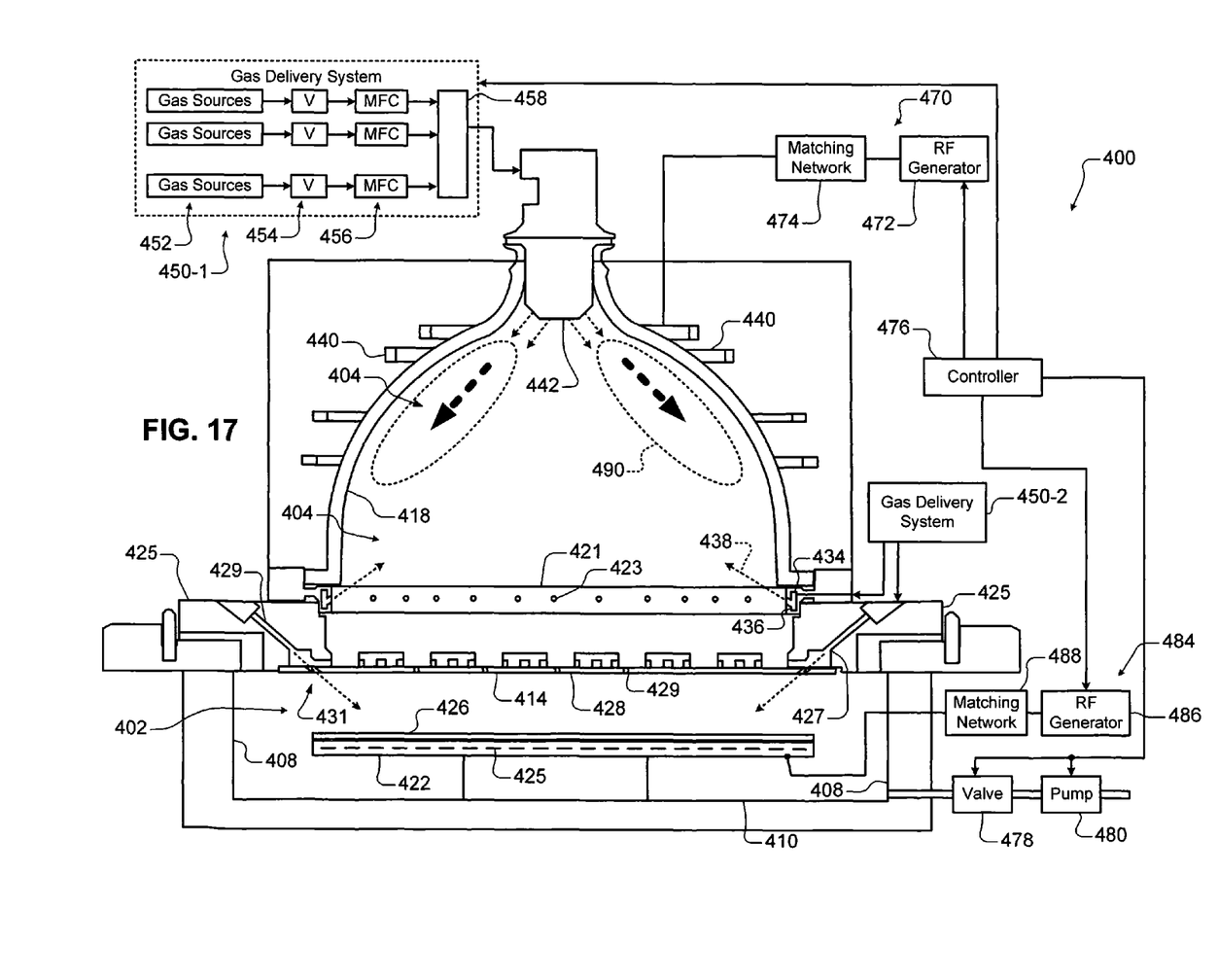
FIG. 17 is a functional block diagram of an example of a processing chamber for etching the stack to planarize asymmetric upper portions of the spacers.

Referring now to FIG. 17, an example of a substrate processing chamber 400 for etching the spacers to planarize the asymmetric upper surface is shown. While a specific substrate processing chamber is shown and described, the methods described herein may be implemented using other types of substrate processing systems.

The substrate processing chamber 400 includes a lower chamber region 402 and an upper chamber region 404. The lower chamber region 402 is defined by chamber sidewall surfaces 408, a chamber bottom surface 410 and a lower surface of a gas distribution device 414.

The upper chamber region 404 is defined by an upper surface of the gas distribution device 414 and an inner surface of a dome 418. In some examples, the dome 418 rests on a first annular support 421. In some examples, the first annular support 421 includes one or more spaced holes 423 for delivering process gas to the upper chamber region 404, as will be described further below. In some examples, the process gas is delivered by the one or more spaced holes 423 in an upward direction at an acute angle relative to a plane including the gas distribution device 414, although other angles/directions may be used. In some examples, a gas flow channel 434 in the first annular support 421 supplies gas to the one or more spaced holes 423.

The first annular support 421 may rest on a second annular support 425 that defines one or more spaced holes 427 for delivering process gas from a gas flow channel 429 to the lower chamber region 402. In some examples, holes 431 in the gas distribution device 414 align with the holes 427. In other examples, the gas distribution device 414 has a smaller diameter and the holes 431 are not needed. In some examples, the process gas is delivered by the one or more spaced holes 427 in a downward direction towards the substrate at an acute angle relative to the plane including the gas distribution device 414, although other angles/directions may be used.

In other examples, the upper chamber region 404 is cylindrical with a flat top surface and one or more flat inductive coils may be used. In still other examples, a single chamber may be used with a spacer located between a showerhead and the substrate support.

A substrate support 422 is arranged in the lower chamber region 404. In some examples, the substrate support 422 includes an electrostatic chuck (ESC), although other types of substrate supports can be used. A substrate 426 is arranged on an upper surface of the substrate support 422 during etching. In some examples, a temperature of the substrate 426 may be controlled by a heater plate 425, an optional cooling plate with fluid channels and one or more sensors (not shown); although any other suitable substrate support temperature control system may be used.

In some examples, the gas distribution device 414 includes a showerhead (for example, a plate 428 having a plurality of spaced holes 429). The plurality of spaced holes 429 extend from the upper surface of the plate 428 to the lower surface of the plate 428. In some examples, the spaced holes 429 have a diameter in a range from 0.4" to 0.75" and the showerhead is made of a conducting material such as aluminum or a non-conductive material such as ceramic with an embedded electrode made of a conducting material.

One or more inductive coils 440 are arranged around an outer portion of the dome 418. When energized, the one or more inductive coils 440 create an electromagnetic field inside of the dome 418. In some examples, an upper coil and a lower coil are used. A gas injector 442 injects one or more gas mixtures from a gas delivery system 450-1.

In some examples, a gas delivery system 450-1 includes one or more gas sources 452, one or more valves 454, one or more mass flow controllers (MFCs) 456, and a mixing manifold 458, although other types of gas delivery systems may be used. A gas splitter (not shown) may be used to vary flow rates of a gas mixture. Another gas delivery system 450-2 may be used to supply an etch gas or an etch gas mixture to the gas flow channels 429 and/or 434 (in addition to or instead of etch gas from the gas injector 442).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 442 includes a center injection location that directs gas in a downward direction and one or more side injection locations that inject gas at an angle with respect to the downward direction. In some examples, the gas delivery system 450-1 delivers a first portion of the gas mixture at a first flow rate to the center injection location and a second portion of the gas mixture at a second flow rate to the side injection location(s) of the gas injector 442. In other examples, different gas mixtures are delivered by the gas injector 442. In some examples, the gas delivery system 450-1 delivers tuning gas to the gas flow channels 429 and 434 and/or to other locations in the processing chamber as will be described below.

A plasma generator 470 may be used to generate RF power that is output to the one or more inductive coils 440. Plasma 490 is generated in the upper chamber region 404. In some examples, the plasma generator 470 includes an RF generator 472 and a matching network 474. The matching network 474 matches an impedance of the RF generator 472 to the impedance of the one or more inductive coils 440. In some examples, the gas distribution device 414 is connected to a reference potential such as ground. A valve 478 and a pump 480 may be used to control pressure inside of the lower and upper chamber regions 402, 404 and to evacuate reactants.

A controller 476 communicates with the gas delivery systems 450-1 and 450-2, the valve 478, the pump 480, and/or the plasma generator 470 to control flow of process gas, purge gas, RF plasma and chamber pressure. In some examples, plasma is sustained inside the dome 418 by the one or more inductive coils 440. One or more gas mixtures are introduced from a top portion of the chamber using the gas injector 442 (and/or holes 423) and plasma is confined within the dome 418 using the gas distribution device 414.

Confining the plasma in the dome 418 allows volume recombination of plasma species and effusing desired etchant species through the gas distribution device 414. In some examples, there is no RF bias power applied to the substrate 426. As a result, there is no active sheath on the substrate 426 and ions are not hitting the substrate with any finite energy. Some amount of ions will diffuse out of the plasma region through the gas distribution device 414. However, the amount of plasma that diffuses is an order of magnitude lower than the plasma located inside the dome 418. Most of ions in the plasma are lost by volume recombination at high pressures. Surface recombination loss at the upper surface of the gas distribution device 414 also lowers ion density below the gas distribution device 414.

In other examples, an RF bias power generator 484 is provided and includes an RF generator 486 and a matching network 488. The RF bias power can be used to create plasma between the gas distribution device 414 and the substrate support or to create a self-bias on the substrate 426 to attract ions. The controller 476 may be used to control the RF bias power.

In some examples, the RF coil power is in a range from 200 W to 3 kW during etching of the asymmetric upper portion of the spacers. The RF bias power is in a range from 50 W to 1000 W during etching of the asymmetric upper portion of the spacers. In some examples, the etch chemistry includes fluorine based etching chemistry such as sulfur hexafluoride ($SF_6$), nitrogen trifluoride ($NF_3$), carbon tetrafluoride ($CF_4$), difluoromethane ($CH_2F_2$), fluoromethane ($CH_3F$), hexafluoro-2-butyne ($C_4F_6$), and octafluorocyclobutane ($C_4F_8$). The gas mixture during etching may also include an inert gas such as argon (Ar), helium (He) or other noble gases. In some examples, the etch chemistry combination is selective to side-wall polymer passivation.

While the foregoing description relates to planarization of spacers in a double patterning context, the self-limiting nature of the etching process described herein can be used to planarize other asymmetric structures.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system' from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for processing a semiconductor substrate, comprising:
   a) providing a substrate stack including a first layer, a plurality of cores arranged in a spaced relationship on the first layer and one or more underlying layers arranged below the first layer;
   b) depositing a conformal layer on the first layer and the plurality of cores;
   c) partially etching the conformal layer to create spacers arranged adjacent to sidewalls of the plurality of cores, wherein the partial etching of the conformal layer causes upper portions of the spacers to have an asymmetric profile;
   d) selectively etching the plurality of cores relative to the spacers and the first layer;
   e) depositing polymer film on sidewalls of the spacers; and
   f) etching the upper portions of the spacers to remove the asymmetric profile and to planarize the upper portions of the spacers.

2. The method of claim 1, further comprising g) etching the polymer film.

3. The method of claim 2, further comprising repeating b) to g) one or more times.

4. The method of claim 1, wherein f) is performed in a substrate processing chamber including a substrate support, an upper chamber region, an inductive coil arranged outside of the upper chamber region, a lower chamber region including the substrate support and a gas dispersion device arranged between the upper chamber region and the lower chamber region.

5. The method of claim 4, wherein the gas dispersion device includes a plurality of holes in fluid communication with the upper chamber region and the lower chamber region.

6. The method of claim 5, further comprising:
   controlling pressure in the substrate processing chamber during f) in a range from 0.4 Torr to 10 Torr; and
   supplying an etch gas mixture including fluorine-based gas to the upper chamber region.

7. The method of claim 4, further comprising supplying power to the inductive coil in a range from 200 W to 3 kW during f).

8. The method of claim 4, further comprising supplying RF bias power to the substrate support in a range from 50 W to 1000 W during f).

9. The method of claim 6, wherein the etch gas mixture a gas selected form a group consisting of sulfur hexafluoride ($SF_6$), nitrogen trifluoride ($NF_3$), carbon tetrafluoride (CFO, difluoromethane ($CH_2F_2$), fluoromethane ($CH_3F$), hexafluoro-2-butyne ($C_4F_6$), and octafluorocyclobutane ($C_4F_8$).

10. The method of claim 9, wherein the etch gas mixture further includes one or more gases selected from a group consisting of argon (Ar) and helium (He).

11. The method of claim 1, wherein the depositing the conformal layer in b) includes atomic layer deposition.

12. The method of claim 1, wherein the partial etching in c) is performed in an inductively coupled plasma (ICP) chamber.

13. The method of claim 1, wherein the plurality of cores includes amorphous silicon film.

14. The method of claim 1, wherein the conformal layer includes a material selected form a group consisting of silicon nitride, silicon and silicon dioxide.

15. A method for processing a semiconductor substrate, comprising:
   a) providing a substrate stack including a first layer, a plurality of cores arranged in a spaced relationship on the first layer and one or more underlying layers arranged below the first layer;
   b) depositing a conformal layer on the first layer and the plurality of cores;
   c) partially etching the conformal layer to create spacers arranged adjacent to sidewalls of the plurality of cores, wherein the partial etching of the conformal layer causes upper portions of the spacers to have an asymmetric profile, and wherein a polymer film remains on sidewalls of the spacers after c); and d) etching the upper portions of the spacers to remove the asymmetric profile and to planarize the upper portions of the spacers.

16. The method of claim 15, further comprising e) etching the polymer film and the plurality of cores.

17. The method of claim 16, further comprising repeating b) to e) one or more times.

18. The method of claim 1, wherein d) is performed in a substrate processing chamber including a substrate support, an upper chamber region, an inductive coil arranged outside of the upper chamber region, a lower chamber region including the substrate support and a gas dispersion device arranged between the upper chamber region and the lower chamber region.

19. The method of claim 18, wherein the gas dispersion device includes a plurality of holes in fluid communication with the upper chamber region and the lower chamber region.

20. The method of claim 19, further comprising:
controlling pressure in the substrate processing chamber during d) in a range from 0.4 Torr to 10 Torr; and
supplying an etch gas mixture including fluorine-based gas to the upper chamber region.

21. The method of claim 18, further comprising supplying power to the inductive coil in a range from 200 W to 3 kW during d).

22. The method of claim 18, further comprising supplying RF bias power to the substrate support in a range from 50 W to 1000 W during d).

23. The method of claim 20, wherein the etch gas mixture a gas selected form a group consisting of sulfur hexafluoride ($SF_6$), nitrogen trifluoride ($NF_3$), carbon tetrafluoride (CFO, difluoromethane ($CH_2F_2$), fluoromethane ($CH_3F$), hexafluoro-2-butyne ($C_4F_6$), and octafluorocyclobutane ($C_4F_8$).

24. The method of claim 23, wherein the etch gas mixture further includes one or more gases selected from a group consisting of argon (Ar) and helium (He).

25. The method of claim 15, wherein the depositing the conformal layer in b) includes atomic layer deposition.

26. The method of claim 15, wherein the partial etching in c) is performed in an inductively coupled plasma (ICP) chamber.

27. The method of claim 15, wherein the plurality of cores includes amorphous silicon film.

28. The method of claim 15, wherein the conformal layer includes a material selected form a group consisting of silicon nitride, silicon and silicon dioxide.

29. A self-limiting etching method for planarizing asymmetric surfaces of a substrate, comprising:
arranging a substrate on a substrate support of a substrate processing chamber,
wherein the substrate includes a feature including an upper portion with an asymmetric profile, and
wherein the substrate processing chamber includes an upper chamber region, an inductive coil arranged outside of the upper chamber region, a lower chamber region including the substrate support and a gas dispersion device arranged between the upper chamber region and the lower chamber region;
controlling pressure in the substrate processing chamber in a range from 0.4 Torr to 10 Torr;
supplying an etch gas mixture including fluorine-based gas to the upper chamber region; and
etching the upper portion of the feature to remove the asymmetric profile and to planarize the upper portion of the feature.

30. The method of claim 29, further comprising supplying power to the inductive coil in a range from 200 W to 3 kW during the etching.

31. The method of claim 30, further comprising supplying RF bias power to the substrate support in a range from 50 W to 1000 W during the etching.

32. The method of claim 30, wherein the etch gas mixture a gas selected form a group consisting of sulfur hexafluoride ($SF_6$), nitrogen trifluoride ($NF_3$), carbon tetrafluoride ($CF_4$), difluoromethane ($CH_2F_2$), fluoromethane ($CH_3F$), hexafluoro-2-butyne ($C_4F_6$), and octafluorocyclobutane ($C_4F_8$).

* * * * *